(12) United States Patent
Ito et al.

(10) Patent No.: US 9,780,750 B2
(45) Date of Patent: Oct. 3, 2017

(54) AUDIO SIGNAL OUTPUT DEVICE AND AUDIO OUTPUT SYSTEM

(71) Applicant: Funai Electric Co., Ltd., Daito-shi, Osaka (JP)

(72) Inventors: Yuichi Ito, Daito (JP); Atsushi Taniguchi, Saitama (JP); Shigeki Otsuka, Kyotanabe (JP); Kota Hirai, Ibaraki (JP); Takashi Fujii, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 336 days.

(21) Appl. No.: 14/385,632

(22) PCT Filed: Mar. 29, 2013

(86) PCT No.: PCT/JP2013/059435
§ 371 (c)(1),
(2) Date: Sep. 16, 2014

(87) PCT Pub. No.: WO2013/153967
PCT Pub. Date: Oct. 17, 2013

(65) Prior Publication Data
US 2015/0043752 A1    Feb. 12, 2015

(30) Foreign Application Priority Data

Apr. 13, 2012  (JP) ................................. 2012-091827

(51) Int. Cl.
*H03G 3/20*  (2006.01)
*G11B 27/28*  (2006.01)
(Continued)

(52) U.S. Cl.
CPC ............. *H03G 3/20* (2013.01); *G11B 27/034* (2013.01); *G11B 27/105* (2013.01); *G11B 27/28* (2013.01);
(Continued)

(58) Field of Classification Search
CPC ...... H03G 3/20; H03G 3/3005; G11B 27/105; G11B 27/28; G11B 27/034; H04N 21/439;
(Continued)

(56) References Cited

U.S. PATENT DOCUMENTS 8,427,584 B2    4/2013  Higaki
8,447,048 B2    5/2013  Chen et al.
(Continued)

FOREIGN PATENT DOCUMENTS

EP    1 296 450 A2    3/2003
GB    2 314 476 A    12/1997
(Continued)

OTHER PUBLICATIONS

International Search Report (PCT/ISA/210) dated May 21, 2013, with English translation (Five (5) pages).
(Continued)

*Primary Examiner* — Ping Lee
(74) *Attorney, Agent, or Firm* — Crowell & Morning LLP

(57) ABSTRACT

An audio signal output device (1) includes an audio signal output portion (15), a volume setting information acquisition portion (15), and a control portion (10). The control portion is configured to calculate the output volume of an external device on the basis of volume information of content and volume setting information of the external device and perform control of lowering the output volume of the external device in the case where the output volume is higher than a prescribed volume threshold.

13 Claims, 4 Drawing Sheets

(51) Int. Cl.
*G11B 27/10* (2006.01)
*G11B 27/034* (2006.01)
*H04N 21/485* (2011.01)
*H03G 3/30* (2006.01)
*H04N 5/60* (2006.01)
*H04N 21/4363* (2011.01)
*H04N 21/439* (2011.01)

(52) U.S. Cl.
CPC ......... H03G 3/3005 (2013.01); H03G 3/3089 (2013.01); H04N 5/60 (2013.01); H04N 21/439 (2013.01); H04N 21/4852 (2013.01); H04N 21/43635 (2013.01)

(58) Field of Classification Search
CPC . H04N 21/4852; H04N 5/60; H04N 21/43635
See application file for complete search history.

(56) References Cited

U.S. PATENT DOCUMENTS

| | | | |
|---|---|---|---|
| 8,750,536 B2 | 6/2014 | Toba et al. | |
| 2003/0059063 A1* | 3/2003 | Inoue | H03G 7/08 381/104 |
| 2008/0187149 A1* | 8/2008 | Jung | H03G 5/165 381/72 |
| 2010/0157172 A1 | 6/2010 | Chen et al. | |
| 2011/0293113 A1* | 12/2011 | McCarthy | H03G 3/32 381/107 |
| 2012/0121098 A1* | 5/2012 | Gautama | H04R 3/007 381/59 |
| 2012/0180093 A1 | 7/2012 | Ishihara et al. | |
| 2013/0230192 A1 | 9/2013 | Chen et al. | |

FOREIGN PATENT DOCUMENTS

| | | |
|---|---|---|
| JP | 2005-191927 A | 7/2005 |
| JP | 2007-53510 A | 3/2007 |
| JP | 2008-67263 A | 3/2008 |
| JP | 2008-228005 A | 9/2008 |
| JP | 2008-294759 A | 12/2008 |
| JP | 2009-21834 A | 1/2009 |
| JP | 2009-27601 A | 2/2009 |
| JP | 2009-88646 A | 4/2009 |
| JP | 2009-100077 A | 5/2009 |
| JP | 2009-130768 A | 6/2009 |
| JP | 2010-103639 A | 5/2010 |
| JP | 2010-148083 A | 7/2010 |
| JP | 2011-124925 A | 6/2011 |
| JP | 2011-130236 A | 6/2011 |
| WO | WO 2011/040009 A1 | 4/2011 |

OTHER PUBLICATIONS

Japanese language Written Opinion (PCT/ISA/237) dated May 21, 2013 (Three (3) pages).

* cited by examiner

AUDIO SIGNAL OUTPUT DEVICE AND AUDIO OUTPUT SYSTEM

TECHNICAL FIELD

The present invention relates to an audio signal output device and an audio output system, and more particularly, it relates to an audio signal output device and an audio output system each capable of lowering the output volume.

BACKGROUND ART

In general, an audio signal output device capable of lowering the output volume is known when the output volume is high. Such an audio signal output device is disclosed in Japanese Patent Laying-Open No. 2007-053510, for example.

In Japanese Patent Laying-Open No. 2007-053510, there is disclosed a television receiver including a scene section processing portion configured to distinguish a main part section containing a content signal such as a television broadcasting program and a commercial message (CM) section from each other, a volume gain determination portion forming a control signal lowering the volume of the entire CM section in which the output volume is relatively high by a certain amount as compared with the volume of the main part section on the basis of a volume representative value of the CM section and the volume of the main part section immediately prior to the CM section, and an audio processing portion sequentially outputting an audio signal whose volume gain is adjusted on the basis of the control signal from the volume gain determination portion to a speaker. In this television receiver, an average value of the volume for each prescribed time period in the CM section is set to the volume representative value.

PRIOR ART

Patent Document

Patent Document 1: Japanese Patent Laying-Open No. 2007-053510

SUMMARY OF THE INVENTION

Problem to be Solved by the Invention

In the television receiver according to Japanese Patent Laying-Open No. 2007-053510, however, the volume of the entire CM section is lowered by the certain amount as compared with the volume of the main part section, using the average value of the volume for each prescribed time period in the CM section, and hence there is such a problem that a high volume is output in a portion of the CM section where the volume is extremely high even if the volume of the CM section is lowered by the certain amount as compared with the volume of the main part section in the case where the portion where the volume is extremely high exists in the CM section.

The present invention has been proposed in order to solve the aforementioned problem, and an object of the present invention is to provide an audio signal output device and an audio output system each capable of reliably suppressing output at a high volume.

Means for Solving the Problem

An audio signal output device according to a first aspect of the present invention includes an audio signal output portion configured to output an audio signal of content reproduced in an external device outputting audio, a volume setting information acquisition portion configured to acquire volume setting information of the external device, and a control portion acquiring volume information of the audio signal of the content. The control portion is configured to calculate the output volume of the external device on the basis of the volume information of the content and the volume setting information of the external device when the content is reproduced and perform control of lowering the output volume of the external device in the case where the output volume is higher than a prescribed volume threshold.

In the audio signal output device according to the first aspect of the present invention, as hereinabove described, the control portion calculating the output volume of the external device on the basis of the volume information of the content and the volume setting information of the external device when the content is reproduced and performing control of lowering the output volume of the external device in the case where the output volume is higher than the prescribed volume threshold is provided, whereby the volume actually output from the external device in reproduction can be lowered in a portion where the output volume is higher than the prescribed volume threshold on the basis of the calculation result of the output volume when the content is reproduced. Thus, output of the audio of the content at a high volume from the external device can be reliably suppressed even in the case where a portion where the output volume is extremely high locally exists.

In the aforementioned audio signal output device according to the first aspect, the control portion is preferably configured to calculate the output volume of the external device on the basis of the volume information of the content and the volume setting information of the external device before the content is subsequently reproduced and perform control of reproducing the content on the basis of the audio signal of the content in a state where the control of lowering the output volume of the external device is performed in the case where the output volume is higher than the prescribed volume threshold. According to this structure, the volume actually output from the external device can be sequentially lowered in the portion where the output volume is higher than the prescribed volume threshold when the content is reproduced, and hence the output of the audio of the content at a high volume from the external device can be more reliably suppressed.

In the aforementioned audio signal output device according to the first aspect, the control portion is preferably configured to perform control of lowering the output volume of the external device by lowering the volume information of the content or the volume setting information of the external device depending on an output method used when the audio signal of the content is output from the audio signal output portion to the external device in the case where the output volume is higher than the prescribed volume threshold. According to this structure, either lowering the volume information contained in the content or lowering the volume setting information in the external device can be selected depending on the output method of the audio signal, and hence control of lowering the output volume of the external device can be performed by a method suitable for the output method.

In this case, the control portion is preferably configured to determine whether or not the audio signal of the content is output without conversion from the audio signal output portion to the external device in the case where the output volume is higher than the prescribed volume threshold and perform control of lowering the output volume of the external device by lowering the volume setting information of the external device in the case where the audio signal of the content is output without conversion and lowering the volume information of the content in the case where the audio signal of the content is output with conversion. According to this structure, the volume setting information of the external device is lowered in the case where the audio signal of the content is output without conversion, whereby in the external device, the output volume can be lowered while the content is reproduced faithfully according to the unconverted audio signal of the content. Furthermore, the volume information of the content is lowered in the case where the audio signal of the content is output with conversion, whereby the control portion can perform control of lowering the volume information of the content concurrently with the conversion of the audio signal of the content, and hence control of lowering the output volume of the external device is not required to be performed separately. Thus, processing load generated by the calculation of the control portion can be reduced.

In the aforementioned audio signal output device determining whether or not the audio signal of the content is output without conversion, the control portion is preferably configured to perform control of lowering the output volume of the external device by lowering the volume setting information of the external device only during a specified time period in which the output volume is higher than the prescribed volume threshold in the case where the audio signal of the content is output without conversion and lowering the volume information of the content only during the specified time period in which the output volume is higher than the prescribed volume threshold in the case where the audio signal of the content is output with conversion. According to this structure, the output volume of the external device can be reliably lowered only during the specified time period in which the output volume is higher than the prescribed volume threshold while output of the audio from the external device, with further lowering of the output volume not higher than the prescribed volume threshold, is suppressed.

In the aforementioned audio signal output device lowering the volume setting information of the external device, the control portion is preferably configured to determine whether or not the audio signal of the content is output in the form of a bitstream from the audio signal output portion to the external device in the case where the output volume is higher than the prescribed volume threshold and perform control of lowering the output volume of the external device by lowering the volume setting information of the external device in the case where the audio signal of the content is output in the form of a bitstream and lowering the volume information of the content in the case where the audio signal of the content is not output in the form of a bitstream. In the case where the audio signal of the content is output in the form of a bitstream, the audio signal of the content is output in the state of an original digital audio signal without conversion from the audio signal output portion, and hence it is difficult to modify the volume information contained in the content. In the case where the audio signal of the content is output in the form of a bitstream, the volume output from the external device can be lowered without modifying the volume information of the content by lowering the volume setting information of the external device. In the case where the audio signal of the content is not output in the form of a bitstream, the volume information of the content can be lowered in the audio signal output device, and hence the audio signal output device may not perform communication with the external device or the like to lower the volume setting information, unlike the case of the output in the form of a bitstream. Thus, the volume output from the external device can be easily lowered depending on the output method.

In the aforementioned audio signal output device lowering the volume setting information of the external device, the control portion is preferably configured to calculate the volume setting information of the external device in the case where the volume setting information of the external device is lowered and perform control of lowering the volume setting information of the external device by outputting the volume setting information that has been calculated to the external device. According to this structure, the volume setting information of the external device is calculated in the audio signal output device, whereby it is not required to perform a calculation for lowering the volume setting information in the external device. Thus, processing load generated by the calculation of the external device can be reduced.

In the aforementioned audio signal output device according to the first aspect, the control portion is preferably configured to perform control of acquiring the volume setting information that has been changed from the external device through the volume setting information acquisition portion in the case where the volume setting information of the external device has been changed. According to this structure, the output volume of the external device can be calculated to match the current volume setting information of the external device, and hence the output of the audio of the content at a high volume from the external device can be more reliably suppressed.

In the aforementioned audio signal output device according to the first aspect, the control portion is preferably configured to calculate the output volume of the external device on the basis of an amplification rate included in the volume information of the content and an amplification rate included in the volume setting information of the external device when the content is reproduced. According to this structure, the control portion can easily calculate the output volume of the external device.

In this case, the control portion is preferably configured to perform control of lowering the output volume of the external device by lowering the amplification rate included in the volume information of the content in the case where the output volume is higher than the prescribed volume threshold. According to this structure, it is not necessary for the control portion to instruct the external device to lower the amplification rate included in the volume setting information of the external device, and hence the control portion can easily perform control of lowering the output volume of the external device.

In the aforementioned audio signal output device according to the first aspect, the control portion is preferably configured to perform control of lowering the output volume of the external device such that the output volume becomes substantially equal to the prescribed volume threshold in the case where the output volume is higher than the prescribed volume threshold. According to this structure, in the case where the output volume is higher than the prescribed volume threshold, the audio of the content can be output from the external device in a state where the volume output from the external device is kept to an acceptable maximum volume (volume threshold).

In the aforementioned audio signal output device according to the first aspect, the prescribed volume threshold is preferably settable by a user. According to this structure, the user can set the volume threshold according to the user's preference.

In this case, the control portion is preferably configured to output an audio signal concerning a test tone that the user uses to set the prescribed volume threshold to the external device, and the user can preferably set the prescribed volume threshold by adjusting the output volume of the test tone output from the external device. According to this structure, the user can set the prescribed volume threshold while actually listening to the test tone output to the external device, and hence the volume threshold can be more easily set according to the user's preference.

In the aforementioned audio signal output device according to the first aspect, the control portion is preferably configured to previously calculate the output volume of the external device on the basis of the volume information of the content and the volume setting information of the external device before the content is reproduced during a prescribed time period from when the content starts to be reproduced to when a prescribed time elapses and perform control of lowering the output volume of the external device in the case where the output volume is higher than the prescribed volume threshold. According to this structure, the control portion may not perform processing for calculating the output volume of the external device due to the previously calculated output volume when the content starts to be reproduced, and hence the load on the control portion can be reduced when the content starts to be reproduced.

In the aforementioned audio signal output device according to the first aspect, the control portion is preferably configured to notify a user to select whether or not to perform control of lowering the output volume of the external device in the case where the output volume is higher than the prescribed volume threshold. According to this structure, the user is allowed to select whether or not to perform control of lowering the output volume of the external device while the user is notified that the output volume becomes higher than the prescribed volume threshold. Thus, the user can be inhibited from feeling strange about the lowered output volume, unlike the case where the output volume is lowered suddenly without notification to the user.

An audio output system according to a second aspect of the present invention includes an external device outputting audio and an audio signal output device including an audio signal output portion configured to output an audio signal of content reproduced in the external device, a volume setting information acquisition portion configured to acquire volume setting information of the external device, and a control portion acquiring volume information of the audio signal of the content. The control portion of the audio signal output device is configured to calculate the output volume of the external device on the basis of the volume information of the content and the volume setting information of the external device when the content is reproduced and perform control of lowering the output volume of the external device in the case where the output volume is higher than a prescribed volume threshold.

In the audio output system according to the second aspect of the present invention, as hereinabove described, the control portion calculating the output volume of the external device on the basis of the volume information of the content and the volume setting information of the external device when the content is reproduced and performing control of lowering the output volume of the external device in the case where the output volume is higher than the prescribed volume threshold is provided in the audio signal output device, whereby the volume actually output from the external device in reproduction can be lowered in a portion where the output volume is higher than the prescribed volume threshold on the basis of the calculation result of the output volume when the content is reproduced. Thus, output of the audio of the content at a high volume from the external device can be reliably suppressed even in the case where a portion where the output volume is extremely high locally exists.

In the aforementioned audio output system according to the second aspect, the control portion of the audio signal output device is preferably configured to calculate the output volume of the external device on the basis of the volume information of the content and the volume setting information of the external device before the content is sequentially reproduced and perform control of reproducing the content on the basis of the audio signal of the content in a state where the control of lowering the output volume of the external device is performed in the case where the output volume is higher than the prescribed volume threshold. According to this structure, the volume actually output from the external device can be sequentially lowered in the portion where the output volume is higher than the prescribed volume threshold when the content is reproduced, and hence the output of the audio of the content at a high volume from the external device can be more reliably suppressed.

In the aforementioned audio output system according to the second aspect, the control portion of the audio signal output device is preferably configured to perform control of lowering the output volume of the external device by lowering the volume information of the content or the volume setting information of the external device depending on an output method used when the audio signal of the content is output from the audio signal output portion to the external device in the case where the output volume is higher than the prescribed volume threshold. According to this structure, either lowering the volume information contained in the content or lowering the volume setting information in the external device can be selected depending on the output method of the audio signal, and hence control of lowering the output volume of the external device can be performed by a method suitable for the output method.

In the aforementioned audio output system according to the second aspect, the control portion of the audio signal output device is preferably configured to perform control of acquiring the volume setting information that has been changed from the external device through the volume setting information acquisition portion in the case where the volume setting information of the external device has been changed. According to this structure, the output volume of the external device can be calculated to match the current volume setting information of the external device, and hence the output of the audio of the content at a high volume from the external device can be more reliably suppressed.

In the aforementioned audio output system according to the second aspect, the control portion of the audio signal output device is preferably configured to calculate the output volume of the external device on the basis of an amplification rate included in the volume information of the content and an amplification rate included in the volume setting information of the external device when the content is reproduced. According to this structure, the control portion of the audio signal output device can easily calculate the output volume of the external device.

Effect of the Invention

According to the present invention, as hereinabove described, the output at a high volume can be reliably suppressed.

MODES FOR CARRYING OUT THE INVENTION

An embodiment of the present invention is hereinafter described on the basis of the drawings.

The structure of an audio-video output system 100 according to the embodiment of the present invention is now described with reference to FIGS. 1 and 2.

Figure 1:
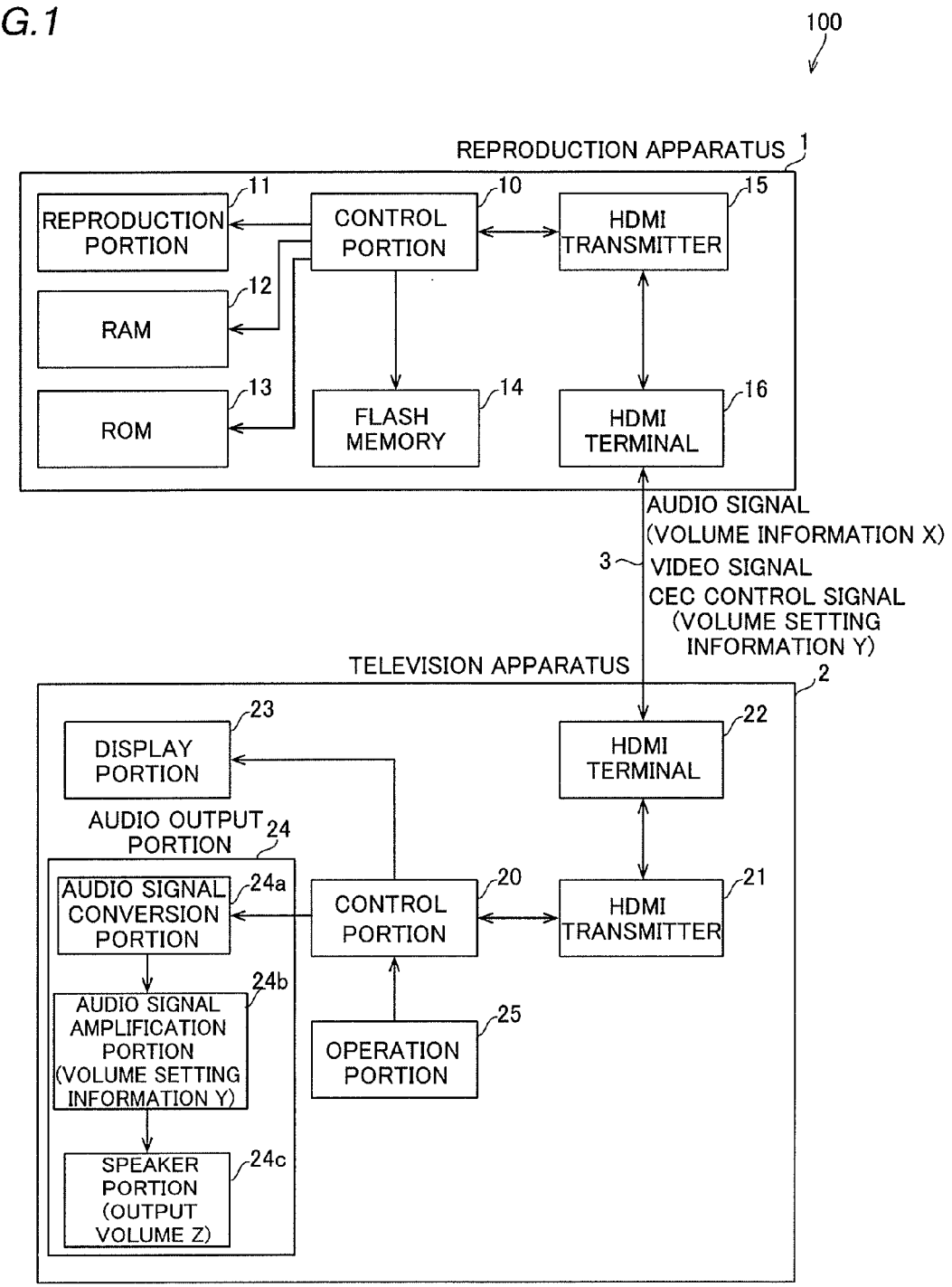
FIG. 1 A block diagram showing the structure of an audio-video output system according to an embodiment of the present invention.

The audio-video output system 100 according to the embodiment of the present invention includes a reproduction apparatus 1 and a television apparatus 2, as shown in FIG. 1. The audio-video output system 100 is an example of the "audio output system" in the present invention, and the reproduction apparatus 1 and the television apparatus 2 are examples of the "audio signal output device" and the "external device" in the present invention, respectively.

The reproduction apparatus 1 and the television apparatus 2 are connected to each other by an HDMI (High-Definition Multimedia Interface) cable 3. Thus, the reproduction apparatus 1 is connected to be capable of outputting an audio signal and a video signal of content to the television apparatus 2.

The reproduction apparatus 1 includes a control portion 10, a reproduction portion 11, a RAM 12, a ROM 13, a flash memory 14, an HDMI transmitter 15, and an HDMI terminal 16 connected with the HDMI cable 3. The control portion 10 includes a CPU and is configured to control the operations of the entire reproduction apparatus 1 by executing a control program. The reproduction portion 11 has a function of retrieving the audio signal and the video signal constituting the content stored in a storage medium such as a VHS tape, a DVD, a BD, an LD, a USB memory, an SD card, or an HDD.

The RAM 12 is a rewritable volatile semiconductor memory, and the control portion 10 is configured to temporarily store the audio signal of the content in the RAM 12. The control portion 10 is configured to acquire volume information X (see FIG. 1) from the audio signal of the content stored in the RAM 12. The volume information X includes an amplification rate defined by $X=10\times\log_{10}(P/P_0)$ (dB). $P_0$ represents a maximum voltage value (prescribed value) capable of being output from the reproduction apparatus 1, and P represents a voltage value actually output from the reproduction apparatus 1. In other words, $(P/P_0)$ is a value not greater than 1, and hence X is a value not greater than 0.

Figure 2:
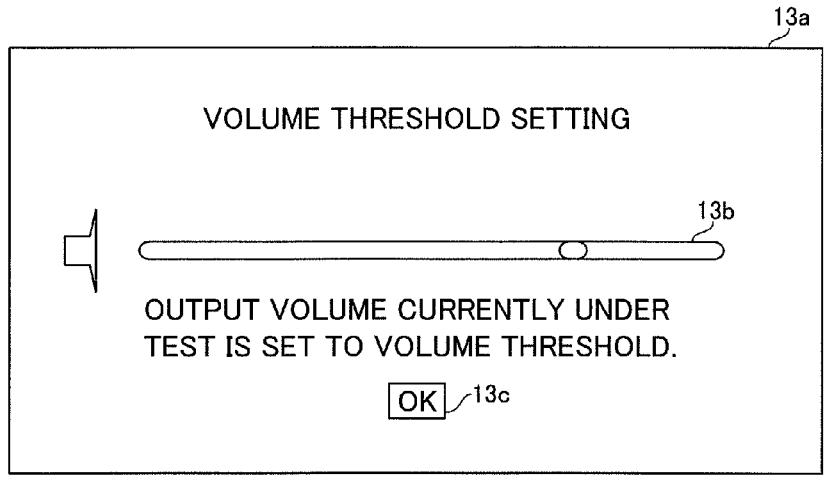
FIG. 2 A diagram showing a setting screen that a user uses to set a volume threshold in the audio-video output system according to the embodiment of the present invention.

The ROM 13 is an unrewritable nonvolatile semiconductor memory and previously stores a video signal constituting a setting screen 13a shown in FIG. 2 and an audio signal constituting a test tone. The audio-video output system 100 is so configured that a user can set a volume threshold $Z_{limit}$, which is the upper limit of an output volume output from the television apparatus 2, on the setting screen 13a. Specifically, the user transversely slides a volume adjustment bar 13b in the setting screen 13a and selects an OK button 13c, whereby the user can set the volume threshold $Z_{limit}$ to be a desirable magnitude.

The HDMI transmitter 15 has a function of transmitting the audio signal and the video signal as digital signals to the television apparatus 2 and a function of establishing bidirectional communication of a CEC (Consumer Electronics Control) control signal with the television apparatus 2. The HDMI transmitter 15 is an example of the "audio signal output portion" or the "volume setting information acquisition portion" in the present invention.

The audio signal of the content is transmitted from the reproduction apparatus 1 to the television apparatus 2 by output either in the form of a bitstream or in an LPCM (Liner Pulse Code Modulation) format. In the output in the form of a bitstream, the audio signal of the content is not converted but is directly transmitted as a digital audio signal retrieved by the reproduction portion 11 of the reproduction apparatus 1 from the HDMI transmitter 15 to the television apparatus 2. In the output in the LPCM format, the digital audio signal of the content is converted into the LPCM format in the control portion 10 of the reproduction apparatus 1 and thereafter is transmitted from the HDMI transmitter 15 to the television apparatus 2.

In the output in the form of a bitstream, it is difficult to transmit the volume information X of the content to the television apparatus 2 in a state where the volume information X of the content is modified by the control portion 10 of the reproduction apparatus 1 whereas in the output in the LPCM format, the volume information X of the content can be transmitted to the television apparatus 2 in the state where the volume information X of the content is modified by the control portion 10. An output format of the audio signal is determined on the basis of an output format previously set with respect to the content or an output format selected by the user.

The television apparatus 2 includes a control portion 20, an HDMI transmitter 21, an HDMI terminal 22 connected with the HDMI cable 3, a display portion 23, an audio output portion 24, and an operation portion 25 configured to accept operations on the television apparatus 2 and the reproduction apparatus 1 from the user. The control portion 20 is configured to control the operations of the entire television apparatus 2. The HDMI transmitter 21 has a function of receiving the audio signal and the video signal from the reproduction apparatus 1 and a function of establishing bidirectional communication of the CEC control signal with the reproduction apparatus 1. The display portion 23 has a function of displaying video on the basis of the video signal.

The audio output portion 24 has an audio signal conversion portion 24a, an audio signal amplification portion 24b, and a speaker portion 24c. The audio signal conversion portion 24a has a function of converting the digital audio signal into an analog audio signal. The audio signal amplification portion 24b has a function of amplifying an audio signal having the volume information X from the reproduction apparatus 1 on the basis of volume setting information Y (see FIG. 1). The volume setting information Y includes an amplification rate defined by $Y=10 \times \log_{10}(Q/Q_0)$ (dB). $Q_0$ represents a maximum voltage value (prescribed value) capable of being output from the audio signal amplification portion 24b, and Q represents a voltage value actually output from the audio signal amplification portion 24b. In other words, $(Q/Q_0)$ is a value not greater than 1, and hence Y is a value not greater than 0.

Thus, the audio signal amplification portion 24b is configured to amplify the audio signal from the reproduction apparatus 1 to an output volume Z (=volume information X+volume setting information Y) (dB). The speaker portion 24c is configured to output the audio of the content at the output volume Z amplified in the amplification in the audio signal amplification portion 24b.

Control processing flows for setting the volume threshold $Z_{limit}$ of the control portion 10 of the reproduction apparatus 1 and the control portion 20 of the television apparatus 2 are now described with reference to FIGS. 1 to 3.

Figure 3:
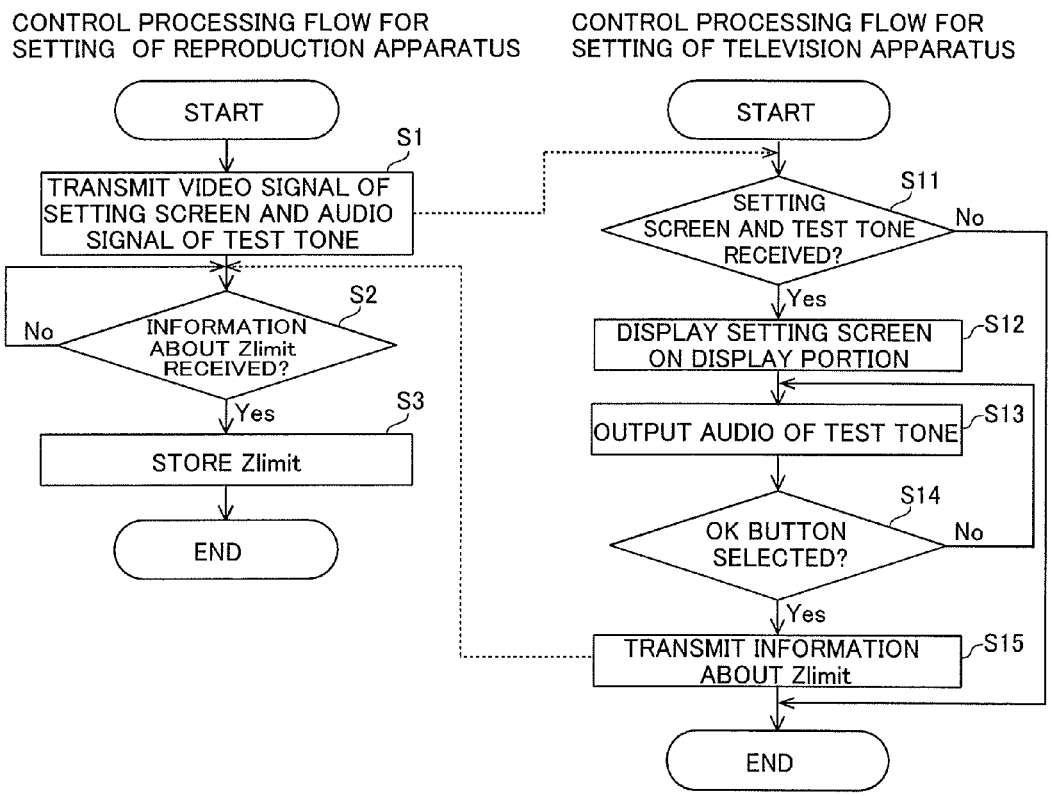
FIG. 3 A diagram showing control processing flows of a reproduction apparatus and a television apparatus when the user sets the volume threshold in the audio-video output system according to the embodiment of the present invention.

The user performs an operation of setting the volume threshold $Z_{limit}$ on an unshown menu screen, whereby in the reproduction apparatus 1, the control portion 10 (see FIG. 1) retrieves the video signal of the setting screen 13a (see FIG. 2) and the audio signal of the test tone from the ROM 13 (see FIG. 1) and transmits the same to the television apparatus 2 (see FIG. 1) at a step S1, as shown in FIG. 3.

In the television apparatus 2, the control portion 20 (see FIG. 1) determines whether or not the video signal of the setting screen 13a and the audio signal of the test tone have been received from the reproduction apparatus 1 and repeats this determination until the control portion 20 determines that the setting screen 13a and the test tone have been received at a step S11. When determining that the setting screen 13a and the test tone have been received, the control portion 20 displays the setting screen 13a on the display portion 23 (see FIG. 1) at a step S12 and outputs the test tone at a prescribed output volume from the speaker portion 24c (see FIG. 1) at a step S13.

Thereafter, the user operates the operation portion 25 to slide the volume adjustment bar 13b (see FIG. 2) and adjust the output volume to a certain volume. Then, the control portion 20 determines whether or not the OK button 13c (see FIG. 2) has been selected at a step S14. When determining that the OK button 13c has not been selected, the control portion 20 returns to the step S13 and outputs the test tone at the prescribed output volume from the speaker portion 24c again. When determining that the OK button 13c has been selected, the control portion 20 determines that the volume of the volume adjustment bar 13b at the time when the OK button 13c has been selected is the volume threshold $Z_{limit}$. Then, the control portion 20 transmits information about the volume threshold $Z_{limit}$ with the CEC control signal to the reproduction apparatus 1 at a step S15. Control performed by the control portion 20 is now terminated.

In the reproduction apparatus 1, the control portion 10 determines whether or not the information about the volume threshold $Z_{limit}$ has been received and repeats this determination until the control portion 10 determines that the information about the volume threshold $Z_{limit}$ has been received at a step S2. When determining that the information about the volume threshold $Z_{limit}$ has been received, the control portion 10 stores the volume threshold $Z_{limit}$ in the flash memory 14 (see FIG. 1) at a step S3. Control performed by the control portion 10 is now terminated. In this manner, setting of the volume threshold $Z_{limit}$ by the user is completed.

Control processing flows of the control portion 10 of the reproduction apparatus 1 and the control portion 20 of the television apparatus 2 when the content is reproduced are now described with reference to FIGS. 1 and 4 to 6.

Figure 4:
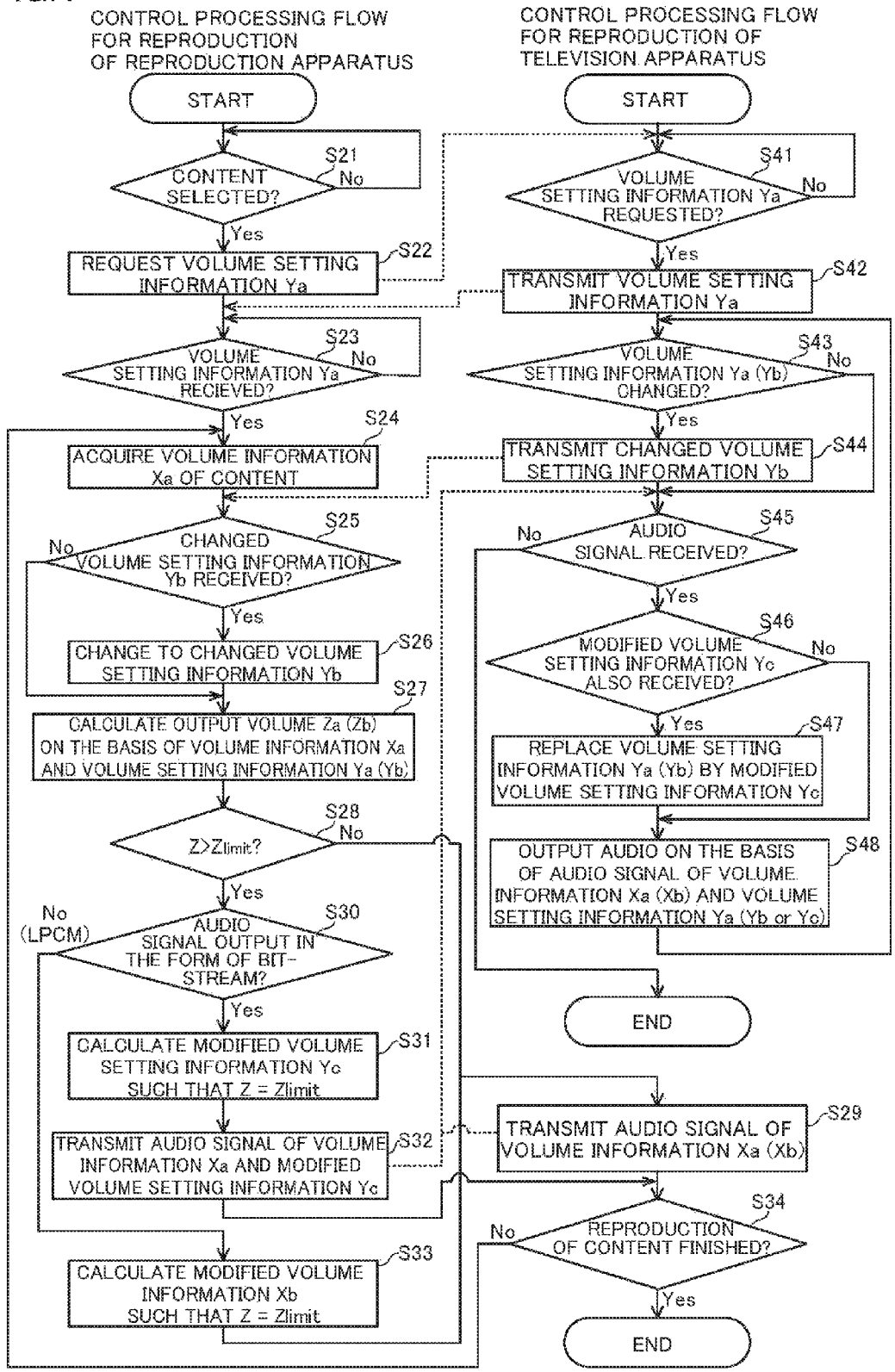
FIG. 4 A diagram showing control processing flows of the reproduction apparatus and the television apparatus when content is reproduced in the audio-video output system according to the embodiment of the present invention.

First, in the reproduction apparatus 1 (see FIG. 1), the control portion 10 (see FIG. 1) determines whether or not the content has been selected by a user operation or the like and repeats this determination until the control portion 10 determines that the content has been selected at a step S21, as shown in FIG. 4. When determining that the content has been selected, the control portion 10 requests the television apparatus 2 (see FIG. 1) to transmit volume setting information Ya currently set in the audio signal amplification portion 24b (see FIG. 1) of the television apparatus 2 with the CEC control signal at a step S22.

In the television apparatus 2, the control portion 20 (see FIG. 1) determines whether or not the reproduction apparatus 1 has requested the transmission of the volume setting information Ya and repeats this determination until the control portion 20 determines that the reproduction apparatus 1 has requested the transmission of the volume setting information Ya at a step S41. When determining that the reproduction apparatus 1 has requested the transmission of the volume setting information Ya, the control portion 20 transmits the volume setting information Ya currently set in the television apparatus 2 with the CEC control signal to the reproduction apparatus 1 at a step S42.

In the reproduction apparatus 1, the control portion 10 determines whether or not the volume setting information Ya has been received from the television apparatus 2 and repeats this determination until the control portion 10 determines that the volume setting information Ya has been received at a step S23. When determining that the volume setting information Ya has been received, the control portion 10 acquires volume information Xa (shown by thin solid lines in FIGS. 5 and 6) of the content temporarily stored in the RAM (see FIG. 1) before the content is sequentially reproduced at a step S24. Then, the control portion 10 advances to a step S25.

In the television apparatus 2, the control portion 20 determines whether or not the volume setting information Ya (changed volume setting information Yb if the volume setting information Ya has been previously changed) set in the television apparatus 2 has been changed to new changed volume setting information Yb by an operation of the operation portion 25 performed by the user or the like at a step S43. When determining that the volume setting information Ya has been changed to the new changed volume setting information Yb, the control portion 20 transmits the new changed volume setting information Yb with the CEC control signal to the reproduction apparatus 1 at a step S44. Then, the control portion 20 advances to a step S45. When determining that the volume setting information Ya has not been changed to the new changed volume setting information Yb, the control portion 20 advances to the step S45.

In the reproduction apparatus 1, the control portion 10 determines whether or not the new changed volume setting information Yb has been received from the television apparatus 2 at the step S25. When determining that the new changed volume setting information Yb has not been received, the control portion 10 advances to a step S27. When determining that the new changed volume setting information Yb has been received, the control portion 10 changes the volume setting information Ya or the changed volume setting information Yb of the television apparatus 2 to the new changed volume setting information Yb at a step S26 and uses the new changed volume setting information Yb to calculate the output volume Z (changed output volume Zb) of the television apparatus 2.

According to this embodiment, the control portion 10 calculates an output volume Za (=Xa+Ya) or the changed output volume Zb (=Xa+Yb) (see FIGS. 5 and 6) on the basis of the volume information Xa and the volume setting information Ya or the changed volume setting information Yb before the content is sequentially reproduced at the step S27. Then, the control portion 10 determines whether or not the output volume Za or the changed output volume Zb is higher than the volume threshold $Z_{limit}$ at a step S28. When determining that the output volume Za or the changed output volume Zb is not higher than the volume threshold $Z_{limit}$, the control portion 10 directly transmits the audio signal of unmodified volume information Xa to the television apparatus 2 through the HDMI cable 3 at a step S29. Then, the control portion 10 advances to a step S34.

When determining that the output volume Za or the changed output volume Zb is higher than the volume threshold $Z_{limit}$ ($Z>Z_{limit}$, output volume modification portions shown in FIGS. 5 and 6), the control portion 10 determines whether or not the audio signal is output from the reproduction apparatus 1 to the television apparatus 2 in the form of a bitstream at a step S30. When determining that the audio signal is output in the form of a bitstream, the control portion 10 modifies the volume setting information Ya or the changed volume setting information Yb of the television apparatus 2 to modified volume setting information Yc such that the output volume Z becomes substantially equal to the volume threshold $Z_{limit}$ in the output volume modification portion shown in FIG. 5 at a step S31. In other words, the modified volume setting information Yc (Yc<Ya or Yc<Yb) is calculated to satisfy Z (=$Z_{limit}$)=Xa+Yc. Consequently, the output volume Z of the content is lowered to a first modified output volume Zc (=Xa+Yc) (shown by a bold solid line in FIG. 5) substantially equal to the volume threshold $Z_{limit}$. The modified volume setting information Yc denotes volume setting information applied only to the volume information Xa during a specified time period in which the calculated output volume Z is higher than the volume threshold $Z_{limit}$, and different modified volume setting information Yc is calculated separately for the volume information Xa during a different time period.

Then, the control portion 10 transmits the audio signal of the volume information Xa and the modified volume setting information Yc that has been modified to the television apparatus 2 at a step S32. The modified volume setting information Yc is transmitted (output) with the CEC control signal to the television apparatus 2. Then, the control portion 10 advances to the step S34.

Figure 6:
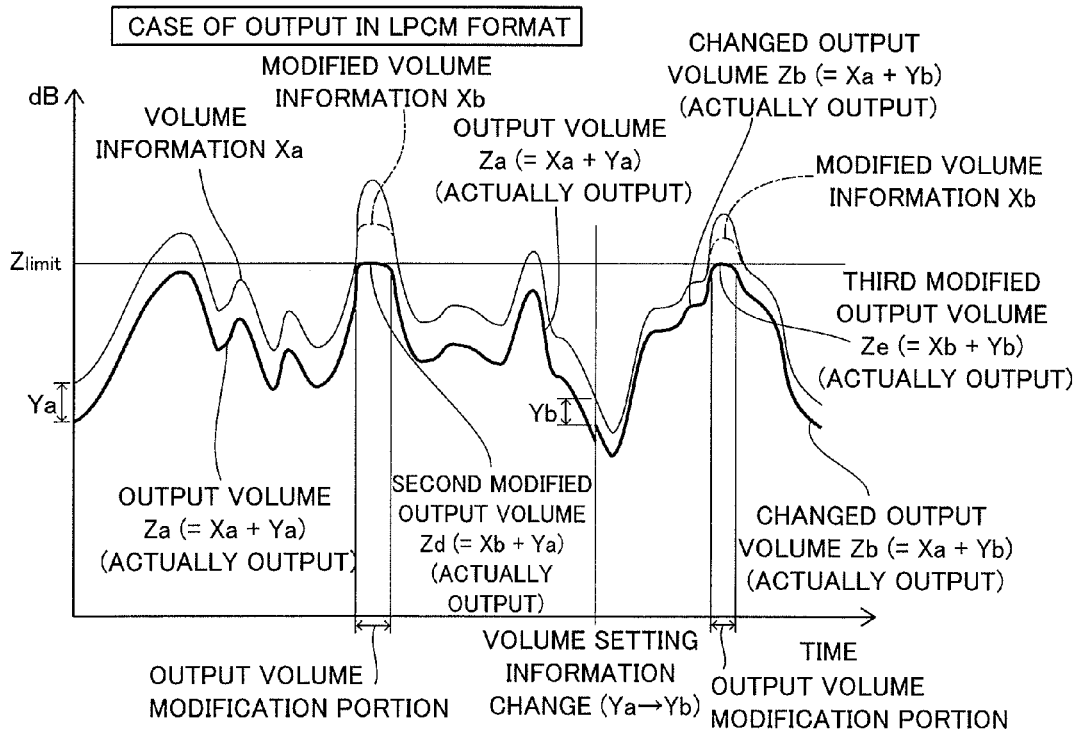
FIG. 6 A schematic view showing output volume control in the case where content is transmitted in an LPCM format from the reproduction apparatus in the audio-video output system according to the embodiment of the present invention.

When determining that the audio signal is not output in the form of a bitstream (has been transmitted in the LPCM format) at the step S30, on the other hand, the control portion 10 modifies the volume information Xa of the content to modified volume information Xb (offsets gains) such that the output volume Z becomes substantially equal to the volume threshold $Z_{limit}$ in the output volume modification portion shown in FIG. 6 at a step S33. In other words, the modified volume information Xb (Xb<Xa) (shown by a one-dot chain line in FIG. 6) is calculated to satisfy Z (=$Z_{limit}$)=Xb+Ya or Z (=$Z_{limit}$)=Xb+Yb. Consequently, the output volume Z of the content is lowered to a second modified output volume Zd (=Xb+Ya) or a third modified output volume Ze (=Xb+Yb) (shown by a bold solid line in FIG. 6) substantially equal to the volume threshold $Z_{limit}$. The modified volume information Xb denotes volume information applied only during the specified time period in which the calculated output volume Z is higher than the volume threshold $Z_{limit}$. Then, the control portion 10 transmits the audio signal of the modified volume information Xb that has been modified to the television apparatus 2 at the step S29. Then, the control portion 10 advances to the step S34.

Then, the control portion 10 determines whether or not the reproduction of the content has been finished when the audio signal of the content is no more retrieved at the step S34. When determining that the reproduction of the content has not been finished, the control portion 10 returns to the step S24 and repeats the aforementioned control processing for content reproduction. When determining that the reproduction of the content has been finished, on the other hand, control performed by the control portion 10 is terminated.

Meanwhile, in the television apparatus 2, the control portion 20 determines whether or not the audio signal has been received from the reproduction apparatus 1 at the step S45. When determining that the audio signal has not been received, the control portion 20 determines that the reproduction of the content has been finished, and control performed by the control portion 20 is terminated.

When determining that the audio signal has been received, the control portion 20 determines whether or not the modified volume setting information Yc has also been received following the audio signal at a step S46. When determining that the modified volume setting information Yc has not been received, the control portion 20 advances to a step S48. When determining that the modified volume setting information Yc has been received, the control portion 20 replaces the volume setting information Ya or the changed volume setting information Yb by the modified volume setting information Yc corresponding to the volume information Xa at a specified time at a step S47.

Figure 5:
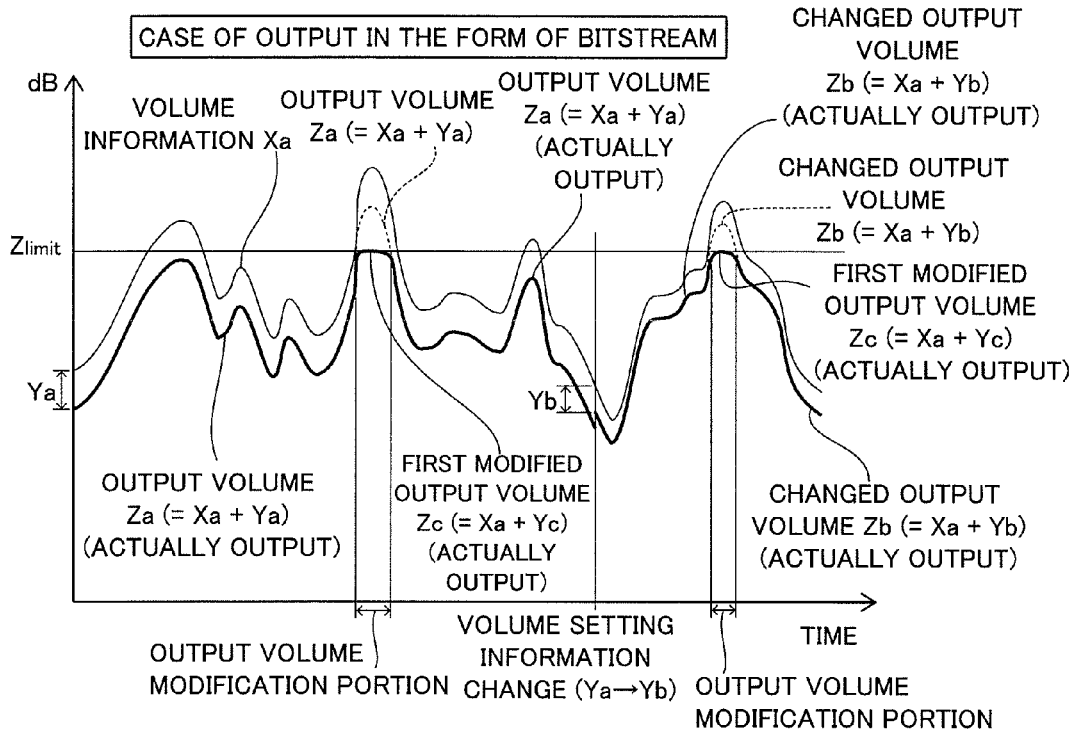
FIG. 5 A schematic view showing output volume control in the case where content is output in the form of a bitstream from the reproduction apparatus in the audio-video output system according to the embodiment of the present invention.

In the case where the audio signal is output in the form of a bitstream, the control portion 20 amplifies the audio signal of the volume information Xa in the audio signal amplification portion 24b on the basis of the volume setting information Ya, the changed volume setting information Yb, or the modified volume setting information Yc and sequentially outputs and reproduces the audio of the content at the output volume Za (=Xa+Ya), the changed output volume Zb (=Xa+Yb), or the first modified output volume Zc (=Xa+Yc) (shown by the bold solid line in FIG. 5) from the speaker portion 24c, as shown in FIG. 5, at the step S48. At this time, the output volume Za, the changed output volume Zb, or the first modified output volume Zc of the television apparatus 2 is always equal to or lower than the volume threshold $Z_{limit}$.

In the case where the audio signal is transmitted in the LPCM format, the control portion 20 amplifies the audio signal of the volume information Xa or the modified volume information Xb in the audio signal amplification portion 24b on the basis of the volume setting information Ya or the changed volume setting information Yb and sequentially outputs and reproduces the audio of the content at the output volume Za (=Xa+Ya), the changed output volume Zb (=Xa+

Yb), the second modified output volume Zd (=Xb+Ya), or the third modified output volume Ze (=Xb+Yb) (shown by the bold solid line in FIG. 6) from the speaker portion 24c, as shown in FIG. 6, at the step S48. At this time, the output volume Za, the changed output volume Zb, the second modified output volume Zd, or the third modified output volume Ze of the television apparatus 2 is always equal to or lower than the volume threshold $Z_{limit}$.

Thereafter, the control portion 20 returns to the step S43 and repeats the aforementioned control processing for content reproduction until the control portion 20 determines that the audio signal has not been received (makes a determination of "No" at the step S45).

Therefore, in the output in the form of a bitstream, the control portion 10 calculates the modified volume setting information Yc (Yc<Ya or Yc<Yb) in the case where the output volume Za or the changed output volume Zb is higher than the volume threshold $Z_{limit}$ (output volume modification portion) and performs control of lowering the output volume Z to the first modified output volume Zc only during the specified time period in which the calculated output volume Z is higher than the volume threshold $Z_{limit}$, as shown in FIG. 5. In the output in the LPCM format, the control portion 10 calculates the modified volume information Xb (Xb<Xa) in the case where the output volume Za or the changed output volume Zb is higher than the volume threshold $Z_{limit}$ (output volume modification portion) and performs control of lowering the output volume Z to the second modified output volume Zd or the third modified output volume Ze only during the specified time period in which the calculated output volume Z is higher than the volume threshold $Z_{limit}$, as shown in FIG. 6. Consequently, the volume output from the television apparatus 2 becomes equal to or lower than the volume threshold $Z_{limit}$.

As shown in FIGS. 5 and 6, the changed output volume Zb is calculated on the basis of the changed volume setting information Yb that has been changed even in the case where the volume setting information Y is changed to the changed volume setting information Yb in the television apparatus 2. When the changed output volume Zb is higher than the volume threshold $Z_{limit}$ (output volume modification portion), the control portion 10 calculates the modified volume setting information Yc and performs control of lowering the changed output volume Zb to the first modified output volume Zc in the case of the output in the form of a bitstream. In the case of the output in the LPCM format, the control portion 10 calculates the modified volume information Xb and performs control of lowering the changed output volume Zb to the third modified output volume Ze. Consequently, the volume output from the television apparatus 2 becomes equal to or lower than the volume threshold $Z_{limit}$ even in the case where the volume setting information Y is changed to the changed volume setting information Yb.

According to this embodiment, as hereinabove described, when the content is reproduced, the control portion 10 calculates the output volume Za (=Xa+Ya) or the changed output volume Zb (=Xa+Yb) on the basis of the volume information Xa and the volume setting information Ya or the changed volume setting information Yb before the content is sequentially reproduced, and performs control of lowering the output volume Z to the first modified output volume Zc (=Xa+Yc), the second modified output volume Zd (=Xb+Ya), or the third modified output volume Ze (=Xb+Yb) in the case where the output volume Za or the changed output volume Zb is higher than the volume threshold $Z_{limit}$. Thus, the volume actually output from the television apparatus 2 in reproduction can be sequentially lowered in the output volume modification portion on the basis of the calculation result of the output volume Za or the changed output volume Zb, and hence output of the audio of the content at a high volume from the television apparatus 2 can be more reliably suppressed even in the case where a portion where the output volume Z is extremely high locally exists. Furthermore, the output of the audio of the content at the high volume from the television apparatus 2 can be more reliably suppressed as compared with the case where the control portion 10 performs control of lowering the output volume Z on the basis of only one of the volume information X and the volume setting information Y.

According to this embodiment, as hereinabove described, when the output volume Za or the changed output volume Zb is higher than the volume threshold $Z_{limit}$ in the output in the form of a bitstream, the control portion 10 calculates the modified volume setting information Yc (Yc<Ya or Yc<Yb) and performs control of lowering the output volume Z to the first modified output volume Zc, and when the output volume Za or the changed output volume Zb is higher than the volume threshold $Z_{limit}$ in the output in the LPCM format, the control portion 10 calculates the modified volume information Xb (Xb<Xa) and performs control of lowering the output volume Z to the second modified output volume Zd or the third modified output volume Ze. Thus, either lowering the volume information Xa of the content to the modified volume information Xb or lowering the volume setting information Ya or the changed volume setting information Yb to the modified volume setting information Yc in the television apparatus 2 can be selected depending on an output method of the audio signal, and hence control of lowering the output volume Z of the television apparatus 2 can be performed by a method suitable for the output method.

According to this embodiment, as hereinabove described, in the case of the output in the form of a bitstream in which the audio signal of the content is output without conversion, the control portion 10 calculates the modified volume setting information Yc and performs control of lowering the output volume Z to the first modified output volume Zc. Thus, in the television apparatus 2, the output volume can be lowered while the content is reproduced faithfully according to the unconverted audio signal of the content. In the case of the output in the LPCM format in which the audio signal of the content is output with conversion, the control portion 10 calculates the modified volume information Xb and performs control of lowering the output volume Z to the second modified output volume Zd or the third modified output volume Ze. Thus, the control portion 10 can perform control of lowering the volume information Xa of the content to the modified volume information Xb concurrently with the conversion of the audio signal of the content, and hence control of lowering the output volume Z of the television apparatus 2 is not required to be performed separately. Thus, processing load generated by the calculation of the control portion 10 can be reduced.

According to this embodiment, as hereinabove described, when the output volume Za or the changed output volume Zb is higher than the volume threshold $Z_{limit}$ in the output in the form of a bitstream, the control portion 10 calculates the modified volume setting information Yc and performs control of lowering the output volume Z to the first modified output volume Zc only during the specified time period in which the calculated output volume Z is higher than the volume threshold $Z_{limit}$. When the output volume Za or the changed output volume Zb is higher than the volume threshold $Z_{limit}$ in the output in the LPCM format, the control portion 10 calculates the modified volume information Xb and performs control of lowering the output volume Z to the second modified output volume Zd or the third modified output volume Ze only during the specified time period in which the calculated output volume Z is higher than the volume threshold $Z_{limit}$. Thus, the output volume Z of the television apparatus 2 can be reliably lowered only during the specified time period in which the output volume Z is higher than the volume threshold $Z_{limit}$ while output of the audio from the television apparatus 2, with further lowering of the output volume Z not higher than the volume threshold $Z_{limit}$, is suppressed.

According to this embodiment, as hereinabove described, the control portion 10 is configured to calculate the modified volume setting information Yc (Yc<Ya or Yc<Yb) of the television apparatus 2 in the output in the form of a bitstream and to calculate the modified volume information Xb (Xb<Xa) of the content in the output in the LPCM format. Thus, the volume setting information Ya or the changed volume setting information Yb is lowered to the modified volume setting information Yc when the audio signal of the content is output in the form of a bitstream, whereby the volume output from the television apparatus 2 can be lowered without modifying the volume information Xa that is difficult to modify. Furthermore, the volume information Xa can be lowered to the modified volume information Xb in the reproduction apparatus 1 when the audio signal of the content is output in the LPCM format, and hence the reproduction apparatus 1 may not perform communication with the television apparatus 2 to lower the volume setting information Ya or the changed volume setting information Yb, unlike the case of the output in the form of a bitstream. Thus, the volume output from the television apparatus 2 can be easily lowered depending on the output method.

According to this embodiment, as hereinabove described, the control portion 10 calculates the modified volume setting information Yc and transmits the audio signal of the volume information Xa and the modified volume setting information Yc to the television apparatus 2, whereby it is not required to perform a calculation for lowering the volume setting information Ya or the changed volume setting information Yb to the modified volume setting information Yc in the television apparatus 2. Thus, processing load generated by the calculation of the control portion 20 of the television apparatus 2 can be reduced.

According to this embodiment, as hereinabove described, when determining that the changed volume setting information Yb has been received, the control portion 10 changes the volume setting information Ya or the changed volume setting information Yb of the television apparatus 2 to the new changed volume setting information Yb and uses the new changed volume setting information Yb to calculate the changed output volume Zb of the television apparatus 2, whereby the changed output volume Zb of the television apparatus 2 can be calculated to match the current changed volume setting information Yb of the television apparatus 2. Thus, the output of the audio of the content at a high volume from the television apparatus 2 can be more reliably suppressed.

According to this embodiment, as hereinabove described, the control portion 10 calculates the output volume Za or the changed output volume Zb on the basis of the volume information Xa and the volume setting information Ya or the changed volume setting information Yb before the content is sequentially reproduced, whereby the calculation of the output volume Za or the changed output volume Zb of the television apparatus 2 can be easily performed before the content is sequentially reproduced.

According to this embodiment, as hereinabove described, when the output volume Za or the changed output volume Zb is higher than the volume threshold $Z_{limit}$ in the output in the LPCM format, the control portion 10 calculates the modified volume information Xb (Xb<Xa) and performs control of lowering the output volume Z to the second modified output volume Zd or the third modified output volume Ze. Thus, it is not necessary for the control portion 10 to instruct the television apparatus 2 to lower the amplification rate included in the volume setting information Ya of the television apparatus 2, and hence the control portion 10 can easily perform control of lowering the output volume Z of the television apparatus 2.

According to this embodiment, as hereinabove described, when the output volume Za or the changed output volume Zb is higher than the volume threshold $Z_{limit}$, the control portion 10 lowers the output volume Z of the content to the first modified output volume Zc, the second modified output volume Zd, or the third modified output volume Ze that are substantially equal to the volume threshold $Z_{limit}$, whereby the audio of the content can be output from the television apparatus 2 in a state where the volume output from the television apparatus 2 is kept to an acceptable maximum volume (volume threshold $Z_{limit}$).

According to this embodiment, as hereinabove described, the control portion 10 retrieves the audio signal of the test tone from the ROM 13 and outputs the same to the television apparatus 2 to output the test tone having the prescribed output volume from the speaker portion 24c, and the user slides the volume adjustment bar 13c to set the output volume Z adjusted to the certain volume to the volume threshold $Z_{limit}$. Thus, the user can set the volume threshold $Z_{limit}$ while actually listening to the test tone output to the television apparatus 2, and hence the volume threshold $Z_{limit}$ can be more easily set according to the user's preference.

The embodiment disclosed this time must be considered as illustrative in all points and not restrictive. The range of the present invention is shown not by the above description of the embodiment but by the scope of claims for patent, and all modifications within the meaning and range equivalent to the scope of claims for patent are further included.

For example, while the example in which the control portion 10 calculates the modified volume setting information Yc when the audio signal is output in the form of a bitstream and calculates the modified volume information Xb when the audio signal is output in the LPCM format has been shown in the aforementioned embodiment, the present invention is not restricted to this. For example, the control portion of the reproduction apparatus may not calculate the modified volume information Xb but calculate the modified volume setting information Yc or calculate both the modified volume information Xb and the modified volume setting information Yc when the audio signal is output in the LPCM format. Furthermore, the audio signal may be transmitted from the reproduction apparatus in an output format other than in the form of a bitstream and in the LPCM format.

While the example in which the control portion of the reproduction apparatus automatically performs control of lowering the output volume when determining to perform control of lowering the output volume has been shown in the aforementioned embodiment, the present invention is not restricted to this. For example, the user may be allowed to select whether or not to perform control of lowering the output volume by displaying a selection screen allowing the user to select whether or not to perform control of lowering the output volume on the display portion of the television apparatus. Thus, the user can be inhibited from feeling strange about the lowered output volume, unlike the case where the output volume is lowered suddenly without notification to the user.

While the example in which the reproduction apparatus 1 serves as the audio signal output device according to the present invention and the television apparatus 2 serves as the external device according to the present invention to constitute the audio-video output system 100 has been shown in the aforementioned embodiment, the present invention is not restricted to this. For example, an amplifier may serve as the audio signal output device according to the present invention and the television apparatus may serve as the external device according to the present invention to constitute the audio-video output system. In this case, the amplifier is configured to receive the audio signal from the reproduction apparatus and transmit the audio signal to the television apparatus and includes a control portion performing control of lowering the output volume of the television apparatus. Alternatively, the reproduction apparatus may serve as the audio signal output device according to the present invention, and an amplifier including a speaker portion capable of outputting the audio may serve as the external device according to the present invention. Alternatively, the audio-video output system may be constituted by a device in which the audio signal output device and the external device are integrally combined. In this case, a signal can be transmitted to and received from each other by serial communication.

Furthermore, a portable music reproduction apparatus may serve as the audio signal output device according to the present invention, and a car audio system, a component system, or the like capable of connecting with the portable music reproduction apparatus may serve as the external device according to the present invention. Thus, output of the audio of the content stored in the music reproduction apparatus at a high volume from the car audio system, the component system, or the like can be suppressed.

While the example in which the output volume Z of the television apparatus according to the present invention is lowered to be substantially equal to the volume threshold $Z_{limit}$ has been shown in the aforementioned embodiment, the present invention is not restricted to this. According to the present invention, the output volume may not be substantially equal to a prescribed volume threshold so far as the output volume of the television apparatus is lowered.

While the example in which the control portion 10 of the reproduction apparatus 1 calculates the output volume Za or the changed output volume Zb of the television apparatus 2 only before the content is sequentially reproduced has been shown in the aforementioned embodiment, the present invention is not restricted to this. According to the present invention, the control portion of the reproduction apparatus may previously perform control of lowering the output volume of the television apparatus only during a prescribed period from when the content starts to be reproduced to when a prescribed time elapses. Thus, the control portion of the reproduction apparatus may not perform processing for calculating the output volume of the television apparatus due to the previously calculated output volume when the content starts to be reproduced, and hence the load on the control portion can be reduced when the content starts to be reproduced.

While the example in which the reproduction apparatus 1 and the television apparatus 2 are connected to each other by the HDMI cable 3 to perform bidirectional communication has been shown in the aforementioned embodiment, the present invention is not restricted to this. For example, the reproduction apparatus and the television apparatus may be connected to each other by a wired LAN or wireless LAN to perform bidirectional communication or may be connected to each other by WirelessHD to perform bidirectional communication. Alternatively, the reproduction apparatus and the television apparatus may be connected to each other on the basis of the IEEE1394 standard to perform bidirectional communication.

While the example in which the volume information of the content having the audio signal and the video signal is used has been shown in the aforementioned embodiment, the present invention is not restricted to this. According to the present invention, the volume information of the content having only the audio signal of a music CD, a music cassette tape, or the like may be used, for example.

While the example in which the control portion 10 determines whether or not the audio signal is output in the form of a bitstream from the reproduction apparatus 1 to the television apparatus 2 after determining that the output volume Za or the changed output volume Zb is higher than the volume threshold $Z_{limit}$ has been shown in the aforementioned embodiment, the present invention is not restricted to this. According to the present invention, the control portion 10 may previously determine whether or not the audio signal is output in the form of a bitstream from the reproduction apparatus 1 to the television apparatus 2 before determining that the output volume Za or the changed output volume Zb is higher than the volume threshold $Z_{limit}$.

While the example in which the HDMI transmitter 15 doubles as the "audio signal output portion" and the "volume setting information acquisition portion" according to the present invention has been shown in the aforementioned embodiment, the present invention is not restricted to this. According to the present invention, the audio signal output portion and the volume setting information acquisition portion may be provided separately.

While the processing operations performed by the control portion according to the present invention are described, using the flowcharts described in a flow-driven manner in which processing is performed in order along a control processing flow for the convenience of illustration in the aforementioned embodiment, the present invention is not restricted to this. According to the present invention, the processing operations performed by the control portion may be performed in an event-driven manner in which processing is performed on an event basis. In this case, the processing operations performed by the control portion may be performed in a complete event-driven manner or in a combination of an event-driven manner and a flow-driven manner.

REFERENCE NUMERALS

1: reproduction apparatus (audio signal output device)
2: television apparatus (external device)
10: control portion
15: HDMI transmitter (audio signal output portion, volume setting information acquisition portion)
100: audio-video output system (audio output system)
X: volume information
Y: volume setting information
Z: output volume
$Z_{limit}$: volume threshold

The invention claimed is:
1. An audio signal output device comprising:
an audio signal output portion that outputs an audio signal of content to an external device;

a volume setting information acquisition portion that acquires volume setting information of the external device; and a control portion that acquires an audio signal level of the content and lowers the volume setting information of the external device in a case where the audio signal of the content to be output from the audio signal output portion is output without conversion and lowers the audio signal level in a case where the audio signal of the content is output with conversion when an output volume of the external device corresponding to the audio signal level and the volume setting information is higher than a prescribed threshold.

2. The audio signal output device according to claim 1, wherein the control portion sequentially compares the output volume with the prescribed threshold before the content is reproduced.

3. The audio signal output device according to claim 1, wherein the control portion lowers the volume setting information of the external device only during a specified time period in which the output volume is higher than the prescribed threshold in the case where the audio signal of the content is output without conversion, and lowers the audio signal level of the content only during the specified time period in which the output volume is higher than the prescribed threshold in the case where the audio signal of the content is output with conversion.

4. The audio signal output device according to claim 1, wherein when the output volume is higher than the prescribed threshold, the control portion lowers the volume setting information of the external device in a case where the audio signal of the content to be output from the audio signal output portion is in the form of a bitstream, and lowers the audio signal level in a case where the audio signal of the content is not in the form of a bitstream.

5. The audio signal output device according to claim 1, wherein the control portion adjusts the volume setting information acquired from the external device and outputs the adjusted volume setting information to the external device in a case where the volume setting information of the external device is lowered.

6. The audio signal output device according to claim 1, wherein the control portion controls the volume setting information acquisition portion to acquire the volume setting information based on change of the volume setting information in the external device.

7. The audio signal output device according to claim 1, wherein the output volume of the external device corresponds to an amplification rate included in the audio signal level and an amplification rate included in the volume setting information of the external device.

8. The audio signal output device according to claim 7, wherein the control portion lowers the amplification rate included in the audio signal level of the content when the output volume is higher than the prescribed threshold.

9. The audio signal output device according to claim 1, wherein the control portion lowers either the audio signal level or the volume setting information such that the output volume becomes substantially equal to the prescribed threshold when the output volume is higher than the prescribed threshold.

10. The audio signal output device according to claim 1, wherein the control portion outputs a video signal of a setting screen and a test audio signal to the external device, and is capable of changing the prescribed threshold.

11. The audio signal output device according to claim 10, wherein the control portion is capable of changing the prescribed threshold by adjusting the output volume of the test audio signal output from the external device.

12. The audio signal output device according to claim 1, wherein the control portion sequentially compares the output volume with the prescribed threshold before the content is reproduced during a prescribed time period from when the content starts to be reproduced to when a prescribed time elapses.

13. The audio signal output device according to claim 1, wherein the control portion notifies a user to select whether or not to perform control of lowering the output volume of the external device when the output volume is higher than the prescribed threshold.

* * * * *